United States Patent
Trent et al.

(10) Patent No.: US 12,414,279 B2
(45) Date of Patent: Sep. 9, 2025

(54) OPTICAL WINDOW WITH EMBEDDED SCREEN

(71) Applicant: Raytheon Company, Waltham, MA (US)

(72) Inventors: Catherine Trent, McKinney, TX (US); Raquel Ovalle-Robles, McKinney, TX (US); James E. Foreman, McKinney, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 18/307,571

(22) Filed: Apr. 26, 2023

(65) Prior Publication Data

US 2023/0345686 A1   Oct. 26, 2023

Related U.S. Application Data

(60) Provisional application No. 63/334,915, filed on Apr. 26, 2022.

(51) Int. Cl.
*H05K 9/00* (2006.01)
*C03C 27/02* (2006.01)

(52) U.S. Cl.
CPC ........... *H05K 9/0086* (2013.01); *C03C 27/02* (2013.01)

(58) Field of Classification Search
CPC ........ H05K 9/0086; C03C 27/02; C03C 3/125
See application file for complete search history.

(56) References Cited

U.S. PATENT DOCUMENTS

| 4,755,659 A | * | 7/1988 | Leon | ........................ H05B 3/84 219/547 |
| 5,173,443 A | | 12/1992 | Biricik et al. | |
| 8,598,623 B2 | | 12/2013 | Yilmaz et al. | |
| 9,722,070 B2 | | 8/2017 | Wang et al. | |

(Continued)

FOREIGN PATENT DOCUMENTS

| CN | 109574479 A | * | 4/2019 |
| EP | 2541559 A1 | | 1/2013 |

(Continued)

OTHER PUBLICATIONS

Santhosh rapid heating (Year: 2016).*

*Primary Examiner* — Jeffrey T Carley
*Assistant Examiner* — Jose K Abraham
(74) *Attorney, Agent, or Firm* — CANTOR COLBURN LLP

(57) ABSTRACT

A method of embedding a screen in a substrate includes placing the screen on the substrate, and then melting part of the substrate, so that the screen becomes embedded in the substrate. The melting may involve heating at least part of the screen to melt part of the substrate, or directly heating the part of the substrate. The screen may be a screen of electrically-conductive material, and the heating may be Joule heating in which an electrical current is passed through the screen to heat the screen. Alternatively, the heating may involve microwave, conductive, or laser heating. The produced device of the substrate with an embedded screen may be an optical window with an embedded electromagnetic interference (EMI) screen, may be a touch screen or touch display, or may be a window with an embedded heating element, to give a few non-limiting examples.

5 Claims, 2 Drawing Sheets

(56) References Cited

U.S. PATENT DOCUMENTS

| | | | |
|---|---|---|---|
| 10,939,596 B1 | 3/2021 | Grosse et al. | |
| 2004/0265550 A1 | 12/2004 | Glatkowski et al. | |
| 2009/0236037 A1 | 9/2009 | Fisher et al. | |
| 2010/0079842 A1 | 4/2010 | Dunleavy et al. | |
| 2011/0110843 A1* | 5/2011 | Pasquali | B82Y 40/00 |
| | | | 423/447.2 |
| 2011/0180385 A1* | 7/2011 | Imholt | B01J 19/126 |
| | | | 422/186.04 |
| 2011/0189500 A1* | 8/2011 | Majumdar | H01L 23/373 |
| | | | 156/60 |
| 2011/0241527 A1* | 10/2011 | Cai | H01J 1/304 |
| | | | 977/750 |
| 2014/0014169 A1* | 1/2014 | Rand | H01L 31/035281 |
| | | | 977/890 |
| 2014/0184092 A1* | 7/2014 | Liu | H05B 41/14 |
| | | | 315/291 |
| 2014/0318836 A1* | 10/2014 | He | G02F 1/1333 |
| | | | 427/457 |
| 2015/0083863 A1* | 3/2015 | Karthauser | F03D 80/40 |
| | | | 219/209 |
| 2016/0311402 A1* | 10/2016 | Suetsugu | B60S 1/026 |
| 2016/0320872 A1* | 11/2016 | Lee | G06F 3/0446 |
| 2016/0347009 A1* | 12/2016 | Gaillard | B29B 15/125 |
| 2017/0165875 A1* | 6/2017 | Gaillard | B29B 15/122 |
| 2018/0239187 A1* | 8/2018 | Hirakata | B32B 27/308 |
| 2018/0339473 A1* | 11/2018 | Zhao | C01B 32/16 |
| 2018/0364541 A1* | 12/2018 | Turner | G02F 1/155 |
| 2019/0212475 A1* | 7/2019 | Jin | C03C 17/42 |
| 2019/0287753 A1* | 9/2019 | Weber | C01B 32/16 |
| 2022/0356312 A1* | 11/2022 | Song | B29C 70/16 |

FOREIGN PATENT DOCUMENTS

| | | | |
|---|---|---|---|
| JP | 2016084254 A | * | 5/2016 |
| JP | 6395044 B2 | * | 9/2018 |
| WO | 2015199624 A1 | | 12/2015 |
| WO | 2021062162 A1 | | 4/2021 |

\* cited by examiner

OPTICAL WINDOW WITH EMBEDDED SCREEN

RELATED APPLICATION

This application claims the benefit of U.S. Provisional Application No. 63/334,915, filed Apr. 26, 2022, which is hereby incorporated herein by reference in its entirety.

FIELD

The present disclosure is in the devices having conductive screens.

BACKGROUND

Current methods of attaching electromagnetic interference (EMI) meshes to an optically transparent material can result in partial delamination of the grid or mesh during encapsulation.

SUMMARY

A method embedding a screen or mesh in a substrate includes placing the mesh or screen on a surface of the substrate, and melting a surface portion of the substrate, thereby allowing at least part of the screen to sink into and embed into the substrate.

A device includes a substrate with an embedded mesh or screen.

According to an aspect of the disclosure, a method of embedding a screen in a substrate includes the steps of: placing the screen on the substrate; and melting some of the substrate, resulting in at least part of the screen embedding into the substrate.

According to an embodiment of any paragraph(s) of this summary, the melting includes heating the screen to cause the screen to melt some of the substrate.

According to an embodiment of any paragraph(s) of this summary, the heating the screen includes Joule heating by passing an electrical current through the screen.

According to an embodiment of any paragraph(s) of this summary, the heating the screen includes heating screen and substrate in a heated environment, such as an oven or the like.

According to an embodiment of any paragraph(s) of this summary, the heating the screen includes microwave heating of the screen.

According to an embodiment of any paragraph(s) of this summary, the heating the screen includes laser heating of at least part of the screen.

According to an embodiment of any paragraph(s) of this summary, the laser heating includes selectively varying laser heating of different parts of the screen, thereby varying the embed depth of the different parts of the screen.

According to an embodiment of any paragraph(s) of this summary, the melting includes directly heating the substrate.

According to an embodiment of any paragraph(s) of this summary, the screen is an electrically-conductive material screen.

According to an embodiment of any paragraph(s) of this summary, the electrically-conductive materials screen is an electrically-conductive mesh formed of electrically-conductive wires.

According to an embodiment of any paragraph(s) of this summary, the heating includes passing an electric current through the electrically-conductive material screen to produce Joule heating.

According to an embodiment of any paragraph(s) of this summary, the electrically-conductive material screen is an electromagnetic interference (EMI) screen.

According to an embodiment of any paragraph(s) of this summary, the electrically-conductive material screen is a metal screen.

According to an embodiment of any paragraph(s) of this summary, the electrically-conductive material screen is a carbon nanotube screen.

According to an embodiment of any paragraph(s) of this summary, the carbon nanotube screen includes carbon nanotube threads or yarns.

According to an embodiment of any paragraph(s) of this summary, the electrically-conductive material screen includes both metal and carbon nanotubes.

According to an embodiment of any paragraph(s) of this summary, the screen is woven.

According to an embodiment of any paragraph(s) of this summary, the screen is nonwoven.

According to an embodiment of any paragraph(s) of this summary, the substrate includes an optical window material.

According to an embodiment of any paragraph(s) of this summary, the substrate includes one or more of the following: zinc sulfide, sapphire, nanocomposite optical ceramic (NCOC), aluminum oxynitride spinel, and yttrium- and/or lanthanum-aluminate glasses.

According to an embodiment of any paragraph(s) of this summary, the substrate includes a non-electrically-conductive (electrical insulating) material.

According to an embodiment of any paragraph(s) of this summary, the substrate includes a polymer.

According to an embodiment of any paragraph(s) of this summary, the method produces an optical window with an embedded EMI screen.

According to an embodiment of any paragraph(s) of this summary, the method produces a touch screen.

According to an embodiment of any paragraph(s) of this summary, the method produces a touch panel.

According to an embodiment of any paragraph(s) of this summary, the method produces a window with a surface heater.

According to an embodiment of any paragraph(s) of this summary, the method produces a window with a defroster or defogger.

According to an embodiment of any paragraph(s) of this summary, the heating the screen includes heating in an inert atmosphere that does not chemically react with the conductive material during the heating.

According to an embodiment of any paragraph(s) of this summary, the heating the screen includes heating in an inert gas atmosphere.

According to an embodiment of any paragraph(s) of this summary, the heating the screen includes heating in an atmosphere that contains argon.

According to an embodiment of any paragraph(s) of this summary, the heating the screen includes heating in an atmosphere that is essentially or substantially free of oxygen.

According to an embodiment of any paragraph(s) of this summary, the heating the screen includes heating in a nitrogen atmosphere.

According to an embodiment of any paragraph(s) of this summary, a method further includes depositing electrically-conductive material along edges of a surface of the substrate.

According to an embodiment of any paragraph(s) of this summary, the depositing the electrically-conductive material includes depositing metal along the edges.

According to an embodiment of any paragraph(s) of this summary, the depositing the electrically-conductive material includes depositing the electrically-conductive material along separate edges on opposite sides of the surface of the substrate.

According to an embodiment of any paragraph(s) of this summary, the depositing occurs after masking the surface to leave the edges exposed.

According to an embodiment of any paragraph(s) of this summary, the depositing occurs before the placing the screen on the substrate.

According to an embodiment of any paragraph(s) of this summary, the placing includes placing the screen in contact with the edges.

According to an embodiment of any paragraph(s) of this summary, the placing includes draping the screen over the substrate.

According to an embodiment of any paragraph(s) of this summary, the placing includes placing with end portions of the screen overhanding and extending beyond edges of the substrate.

According to an embodiment of any paragraph(s) of this summary, a method further includes cutting/trimming the end portions of the screen.

According to an embodiment of any paragraph(s) of this summary, the cutting/trimming of the end portions occurs after the heating of the screen.

According to an embodiment of any paragraph(s) of this summary, a method further includes masking edges of a surface of the substrate by placing masking material over the edges, after the placing the screen on the substrate.

According to an embodiment of any paragraph(s) of this summary, the masking material clamps the screen to the substrate.

According to an embodiment of any paragraph(s) of this summary, the masking material clamps the screen to the electrically-conductive material along edges.

According to an embodiment of any paragraph(s) of this summary, the masking material is an electrically-conductive masking material.

According to an embodiment of any paragraph(s) of this summary, the heating includes applying an electrical current through electrically-conductive masking material and the screen to produce Joule heating in the screen.

According to an embodiment of any paragraph(s) of this summary, the masking material is a metal material.

According to another aspect of the disclosure, a device produced using the method of any paragraph(s) of this summary.

According to yet another aspect of the disclosure, a device includes: a substrate; and a screen at least partially embedded in the substrate.

According to an embodiment of any paragraph(s) of this summary, the device further includes electrically-conductive material along edges of a surface of the substrate.

According to an embodiment of any paragraph(s) of this summary, the electrically-conductive material includes metal along the edges.

According to an embodiment of any paragraph(s) of this summary, the electrically-conductive material is along separate edges on opposite sides of the surface of the substrate.

According to an embodiment of any paragraph(s) of this summary, the device further includes electrically-conductive masking material covering at least in part the electrically conductive material along the edges.

According to an embodiment of any paragraph(s) of this summary, the screen extends between the electrically-conductive material along the edges, and the electrically-conductive masking material.

According to an embodiment of any paragraph(s) of this summary, the device is an optical window with an embedded EMI screen.

According to an embodiment of any paragraph(s) of this summary, the device is a touch screen.

According to an embodiment of any paragraph(s) of this summary, the device is a touch panel.

While a number of features are described herein with respect to embodiments of the disclosure; features described with respect to a given embodiment also may be employed in connection with other embodiments. The following description and the annexed drawings set forth certain illustrative embodiments of the disclosure. These embodiments are indicative, however, of but a few of the various ways in which the principles of the disclosure may be employed. Other objects, advantages, and novel features according to aspects of the disclosure will become apparent from the following detailed description when considered in conjunction with the drawings.

BRIEF DESCRIPTION OF THE DRAWINGS

The annexed drawings, which are not necessarily to scale, show various aspects of the disclosure.

DETAILED DESCRIPTION

A method of embedding a screen in a substrate includes placing the screen on the substrate, and then melting part of the substrate, so that the screen becomes embedded in the substrate. The melting may involve heating at least part of the screen to melt part of the substrate, or directly heating the part of the substrate. The screen may be a screen of electrically-conductive material, and the heating may be Joule heating in which an electrical current is passed through the screen to heat the screen. Alternatively, the heating may involve microwave, conductive, or laser heating. The produced device of the substrate with an embedded screen may be an optical window with an embedded electromagnetic interference (EMI) screen, may be a touch screen or touch display, or may be a window with an embedded heating element, to give a few non-limiting examples.

Figure 1:
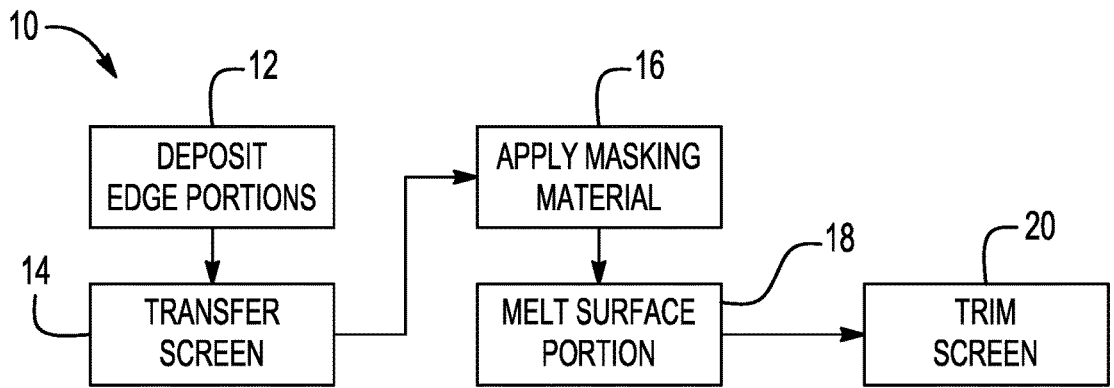
FIG. 1 is a high-level flow chart of a method according to an embodiment.
Figure 2:
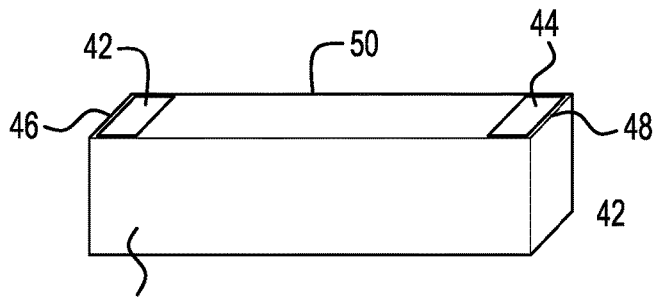
FIG. 2 is an oblique schematic view illustrating a step of the method of FIG. 1.

FIG. 1 shows steps of a method 10 for embedding a screen in a substrate. FIGS. 2-8 illustrate various steps (and alternatives) of the method 10. In step 12, illustrated in FIG. 2, electrically-conductive material edge (or peripheral) portions 42 and 44 are deposited along opposite edges 46 and 48 on a surface 50 of a substrate 40.

The substrate 40 may be any of a variety of suitable substrates. For example the substrate 40 may be a material suitable of an optical window, transparent to light of a desired range of visible or nonvisible wavelengths, for example for use in connection with sensor, such as an infrared (IR) sensor, that may be part of a flight vehicle. Examples of suitable optical window materials may include zinc sulfide (ZnS), sapphire, nanocomposite optical ceramic (NCOC), aluminum oxynitride spinel, and yttrium- and/or lanthanum-aluminate glasses. Such optical window materials may have suitable coatings on them, for example antireflection coatings such as dual antireflection coatings, and/or coatings to resist abrasion and/or other wear, such as rain (and/or sand) enhanced protective coatings. Such coatings may involve a stack of layers of different materials, for example a stack where different materials alternate, one atop of another.

The substrate 40 may be other types of materials as well, such as any of a variety of suitable glasses, such as for windows for ordinary uses. As another alternative, the substrate 40 may be a suitable polymer material. Broadly, the substrate 40 may be a suitable electrically-nonconductive (electrically-insulating) material.

The edge portions 42 and 44 may be made of any of a variety of suitable materials, for example suitable electrically-conductive metals such as copper. The portions 42 and 44 may be deposited by any of a variety of suitable deposition processes, such as electrochemical deposition, soldering, sputtering, or physical deposition. Masking may be involved in the depositing of the edge portions 42 and 44.

The edge portions 42 and 44 are illustrated as along the parallel opposite edges 46 and 48 of the surface 50. More broadly, the portions may be along parts or the whole of a perimeter of a surface of the substrate 40, which may have any of a variety of shapes.

Figure 3:
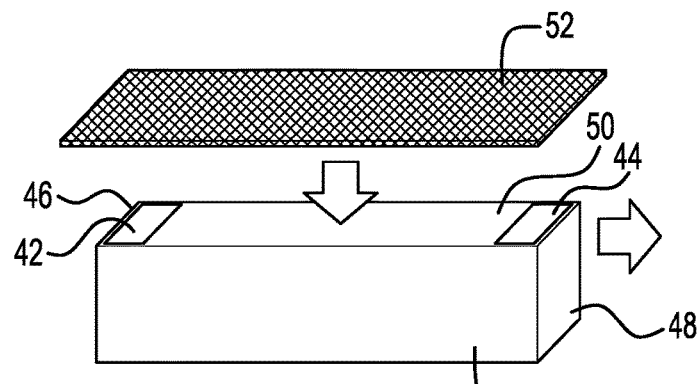
FIG. 3 is an oblique schematic view illustrating another step of the method of FIG. 1.
Figure 4:
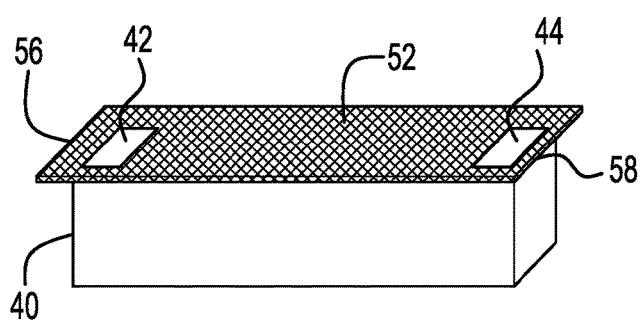
FIG. 4 is an oblique schematic view illustrating another step of the method of FIG. 1.

Referring back to FIG. 1, in step 14 of the method 10 a screen 52 may be transferred onto the substrate surface 50, as illustrated in FIGS. 3 and 4. The screen 52 may be draped onto the surface 50, with ends 56 and 58 of the screen 52 overhanging the substrate 40, and extending beyond the edges 46 and 48.

The screen 52 may have any of a variety of suitable characteristics, and may be made of any of a variety of suitable materials. The screen 52 may be made of woven or nonwoven material. The screen 52 may be an electrically-conductive material screen. For example the screen 52 may be a mesh of electrically-conductive wires, for example electrically-conductive metal wires forming a metal screen. Alternatively the screen 52 may be a carbon nanotube (CNT) screen, for example including carbon nanotube threads or yarns. As another alternative the screen 52 may include a combination of metal and CNTs, for example a combination of conductive metal particles and CNTs.

Figure 5:
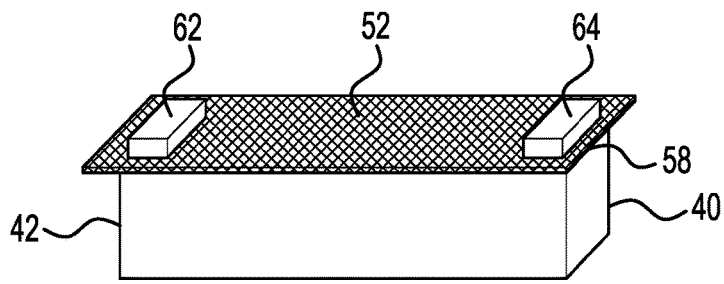
FIG. 5 is an oblique schematic view illustrating another step of the method of FIG. 1.

In step 16 (FIG. 1), masking material 62 and 64 is applied over the edge portions 42 and 44, as illustrated in FIG. 5. The masking material 62 and 64 protects the underlying portions 42 and 44 during subsequent processing steps. The masking material 62 and 64 clamps the screen 52 against the edge portions 42 and 44, holding the screen 52 in place. The masking material 62 and 64 may be electrically-conductive material, for example acting as an electrical contact or busbar for passing current to the screen 52 and to the edge portions 42 and 44. The masking material 62 and 64 may be made of any suitable metal or other conductive material. Mechanical fixturing or taping may be used for putting the masking material 62 and 64 in place, and/or for fixing the screen 52 in place.

Figure 6:
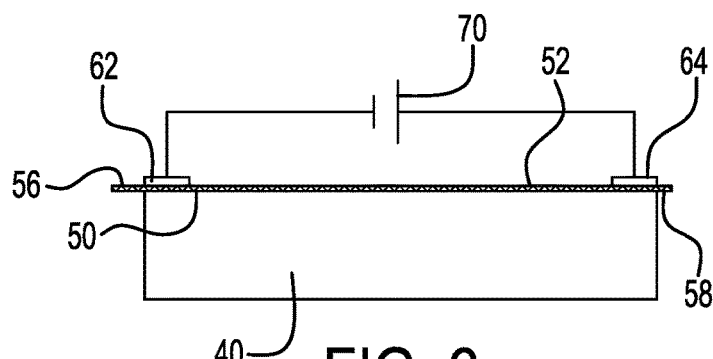
FIG. 6 is a side schematic view illustrating another step of the method of FIG. 1.
Figure 7:
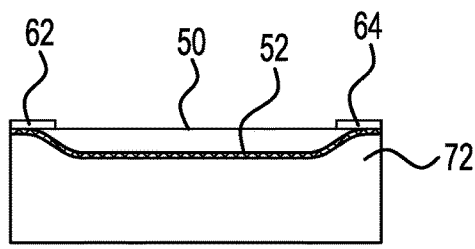
FIG. 7 is a side schematic view illustrating another step of the method of FIG. 1.

In step 18 (FIG. 1) a surface portion of the substrate 40 is melted, which allows at least a portion of the screen 52 to sink into and embed in the substrate 40, below the substrate surface 50. One embodiment of this process is illustrated in FIGS. 6 and 7, in which an electrical potential from an electrical power source 70. This passes an electrical current through the screen 52 via the masking material 62 and 64. This causes resistive heating (Joule heating) in the screen 52 that melts/softens a top portion 72 of the substrate 40 that is adjacent to the screen 52. This allows at least part of the screen 52 to sink into and embed in the top substrate portion 72.

The heating of step 18 (FIG. 1) may be performed in an inert atmosphere, an atmosphere that does not chemically react with the electrically-conductive material of the screen 52 during the heating. The inert atmosphere may include an inert gas, for example argon. More broadly the atmosphere may be substantially free of oxygen or other gaseous materials that would chemically react with the material of the screen 52 during the heating. For example the heating may be performed in a nitrogen atmosphere.

The resulting embedded screen 52 is shown in FIG. 7, with the middle portion of the screen 52, between the edge portions 42 and 44, embedded in the substrate top portion 72 below the substrate surface 50. As shown in FIG. 7, the overhanging ends 56 and 58 (FIG. 6) of the screen 52 may be trimmed, such as in step 20 (FIG. 1), either before or after the melting and embedding process.

Figure 8:
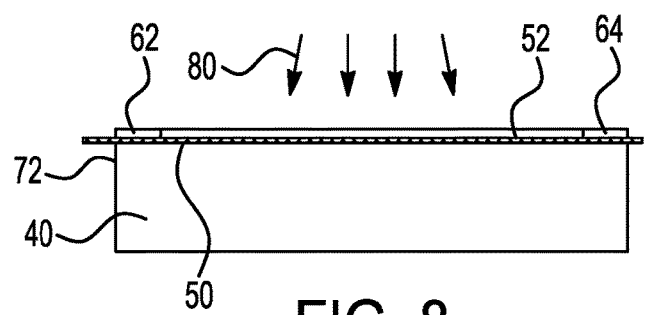
FIG. 8 is a side schematic view illustrating an alternate heating step of the method of FIG. 1.

FIG. 8 shows an alternative method of the melting of the top substrate portion 72. heating of the screen 52, and/or by directly heating the top substrate portion 72. The heating may include application of energy 80 to the screen 52 and/or the substrate top surface 50. The energy 80 may include any of a variety of suitable forms of energy, such as microwaves, conduction, and/or lasers. The energy 80 may indirectly heat the substrate portion 72 by first heating the screen 52, which in turns heats (and melts) the top substrate portion 72. Alternatively or in addition the energy may directly heat the substrate portion 72. The energy 80 may be applied uniformly to the top of the substrate 40, or may be applied nonuniformly, such as only on selected parts of the upper surface, and/or with different intensities and/or durations for different parts of the upper surface. This nonuniformity may be achieved by masking and/or by other control, such as by applying energy only in narrow beams that are smaller than the top surface. The nonuniform heating may achieve effects where only parts of the screen 52 are embedded, and/or where different parts of the screen 52 are embedded to different depths within the substrate 40.

Figure 9:
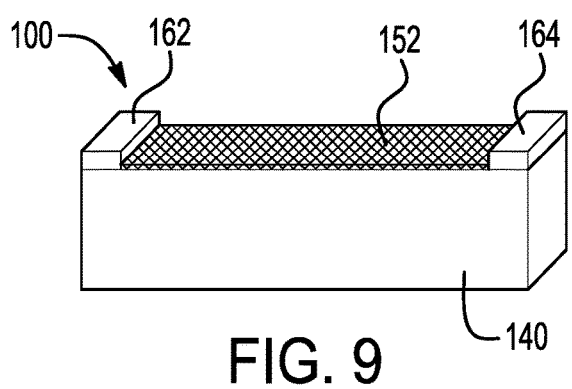
FIG. 9 is an oblique schematic view illustrating a device produced according to an embodiment.

FIG. 9 shows an example of a device 100 produced according to various embodiments of the method 10 (FIG. 1) described above and illustrated in FIGS. 2-8. It should be appreciated that variations in the method, for example reordering steps as appropriate, and/or omitting unnecessary steps. The produced device 100 having a substrate 140 with an embedded screen 152 may be an optical window with an embedded electromagnetic interference (EMI) screen, may be a touch screen or touch display, or may be a window with an embedded heating element, to give a few non-limiting examples. Electrically-conductive material portions 162 and 164 may be retained on the device to make electrical connection with the screen 152.

Although the disclosure has been shown and described with respect to a certain embodiment or embodiments, equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the disclosure. In addition, while a particular feature of the disclosure may have been described above with respect to only one or more of several illustrated embodiments, such feature may be combined with one or more other features of the other embodiments, as may be desired and advantageous for any given or particular application.

What is claimed is:

1. A method of embedding a screen in a substrate, the method comprising:

depositing electrically-conductive material along edges of a surface of the substrate;

placing the screen on the substrate such that the screen contacts the electrically-conductive material along the edges of the surface of the substrate; and melting a portion of the substrate, resulting in at least part of the screen embedding into the substrate, wherein melting the portion of the substrate includes microwave heating of the screen.

2. The method of claim 1, wherein the heating the screen includes heating the screen and substrate in a heated environment.

3. The method of claim 1, wherein melting the portion of the substrate includes directly heating the substrate.

4. The method of claim 1, wherein the substrate includes a non-electrically-conductive material.

5. The method of claim 1, wherein depositing the electrically-conductive material occurs after masking the surface to leave the edges exposed.

* * * * *